United States Patent [19]

Steenhof

[11] Patent Number: 4,992,982
[45] Date of Patent: Feb. 12, 1991

[54] SPS TYPE CHARGE COUPLED DEVICE MEMORY SUITABLE FOR PROCESSING VIDEO INFORMATION WITH INCREASED SPEED

[75] Inventor: Frits A. Steenhof, Eindhoven, Netherlands

[73] Assignee: U.S. Philips Corporation, New York, N.Y.

[21] Appl. No.: 252,847

[22] Filed: Oct. 3, 1988

[30] Foreign Application Priority Data

Oct. 20, 1987 [NL] Netherlands ................... 8702499

[51] Int. Cl.$^5$ .............................................. G11C 13/00
[52] U.S. Cl. ................................... 365/183; 365/233; 365/238
[58] Field of Search ................ 365/183, 238, 193, 233

[56] References Cited

FOREIGN PATENT DOCUMENTS 8105397 11/1981 Netherlands .

OTHER PUBLICATIONS

"Charge Coupled Devices and Systems", Howes et al., John Wiley and Sons Ltd., pp. 200-201, 1980.
"A Digital Field Memory for Television Receivers", Pelgron et al., IEEE Transactions on Consumer Electronics, vol. CE-29, No. 3, Aug. 1983, pp. 242-248.

Primary Examiner—Terrell W. Fears
Attorney, Agent, or Firm—Michael E. Marion

[57] ABSTRACT

An SPS charge coupled device memory is described which is useful for storing video pictures. The memory avoids accumulation of charge below the de-interlacing electrodes controlling the transfer of data to the series output register by using two different procedures for generating the de-interlacing clocks for the odd channels and for the even channels of the parallel section. These procedures are carried out sequentially with an adjustable difference in time.

8 Claims, 5 Drawing Sheets

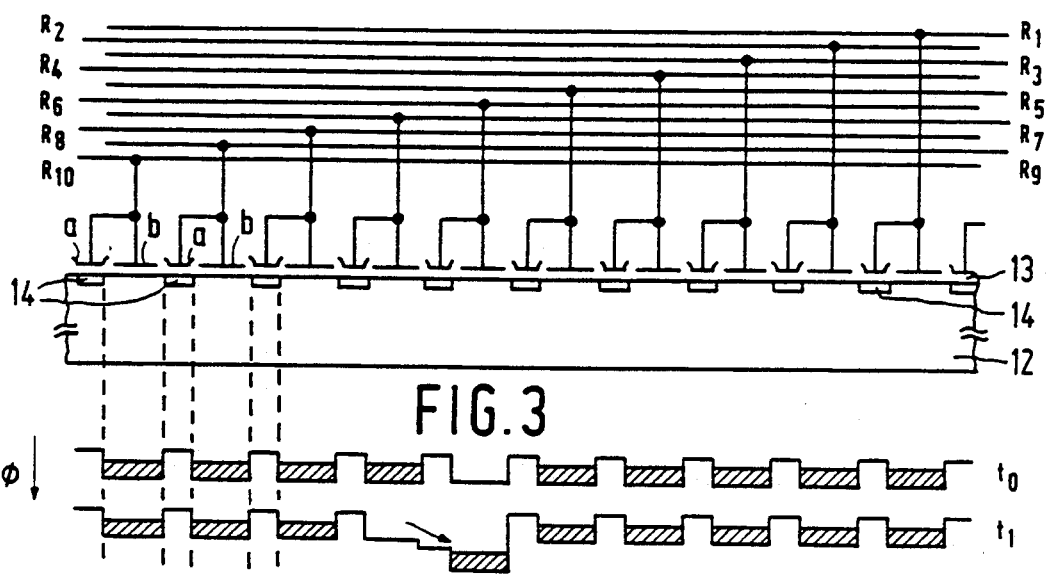
FIG. 3
FIG. 4
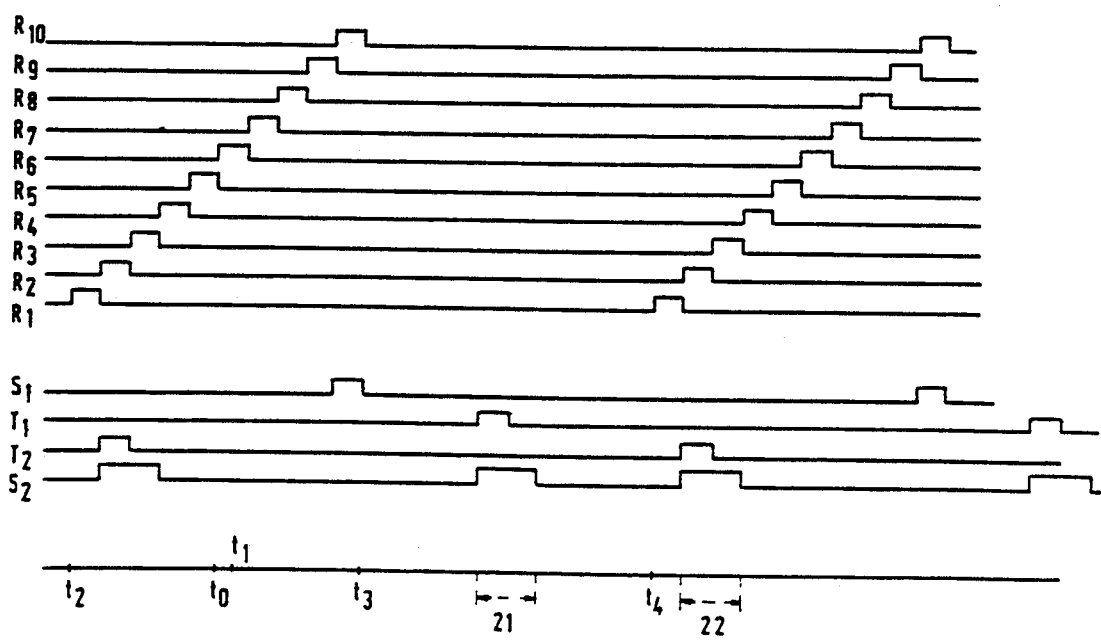
FIG. 5

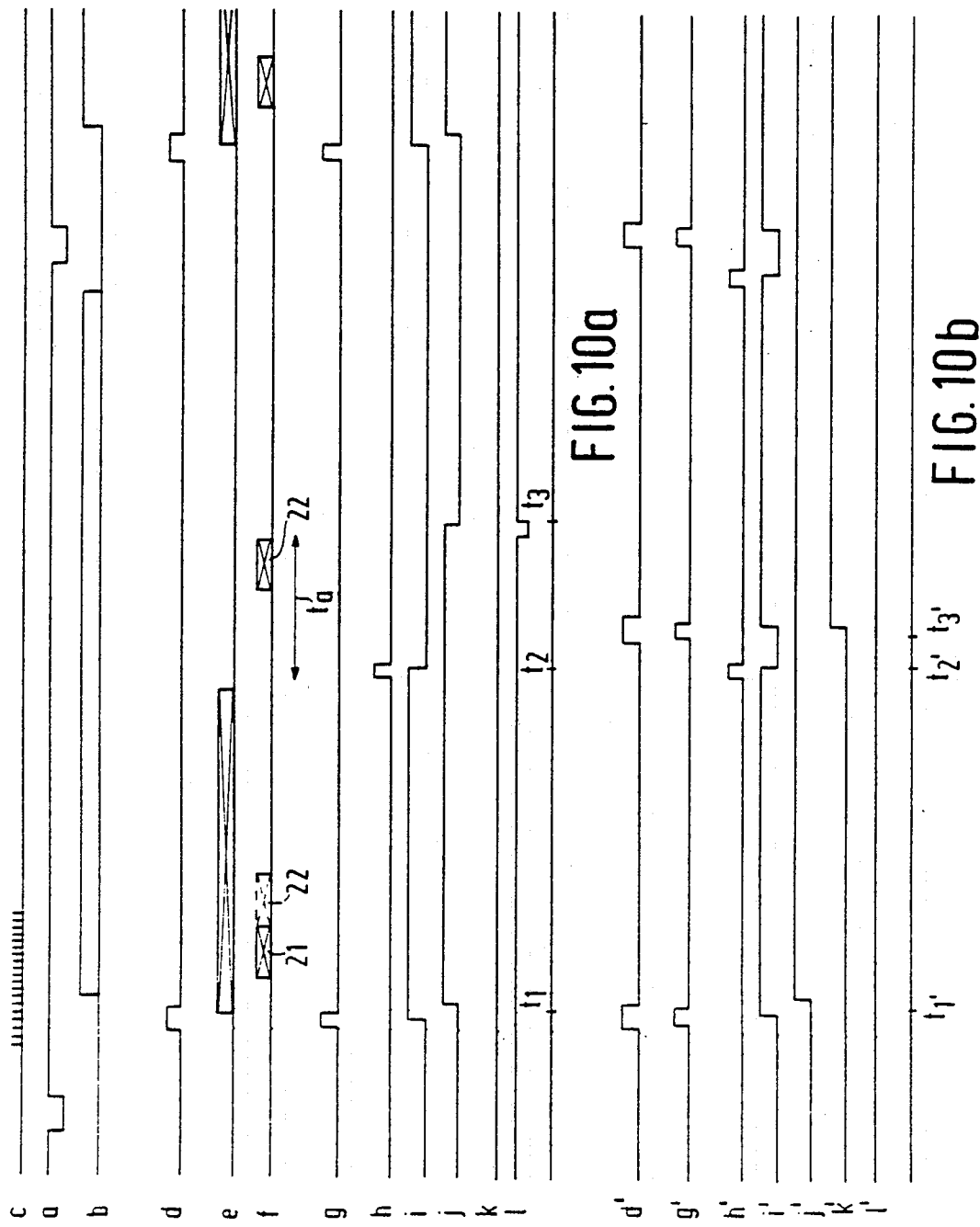

SPS TYPE CHARGE COUPLED DEVICE MEMORY SUITABLE FOR PROCESSING VIDEO INFORMATION WITH INCREASED SPEED

BACKGROUND OF THE INVENTION

The invention relates to a semiconductor memory comprising a charge-coupled device of the SPS type having a series input register, a parallel section and a series output register, the number of data that can be stored per line in the parallel section being the n-multiple (where n=integer larger than or equal to 2) of the number of data that can be stored in the series input register and the series output register, while at the transition between the parallel section and the series output register an electrode configuration is present (designated as de-interlacing electrodes), by means of which a line of data in the parallel section can be split up into n sublines which can be transported successively in the series output register, the parallel section being provided with clock voltage means with the aid of which the data are transported at an adjustable speed through the parallel section.

Series-parallel-series memories, mostly abbreviated to SPS memories, are generally known. The data are serially supplied to the input register and are transferred to the parallel section via the parallel outputs of the input register. The output register is provided with a number of parallel inputs and a series output. Via the parallel inputs, data can be transferred simultaneously to the series output register and be read out serially at the outputs.

In memories of the kind mentioned in the opening paragraph, which are known inter alia from the chapter "Interlaced SPS" on pages 200 ff. of the book "Charge-Coupled Devices and Systems" of Howes and Morgan, published by John Wiley and Sons Ltd., Edition 1980, one stage of the series registers corresponds to to two parallel registers. During the read-in operation, the series input register is filled twice with a subline. These sublines are interlaced to a complete line in the parallel section. At the other end of the parallel section, this line is split up again into a number of sublines, which are read out successively via the series output register (de-interlacing). This interlace-de-interlace method has a number of important advantages, the main advantage residing in the fact that an increase of the packing density in the parallel section and hence a large gain in space can be obtained. For this reason, SPS memories are provided practically always with duel interlacing, the storage capacity in the parallel section thus being per line twice the capacity of the series registers. For the sake of simplicity, it will be assumed hereinafter that the factor is n=2, but it should be considered that this is not essential to the invention and that n may also be larger than 2.

A specific Application of the SPS memory is described inter alia in the article "A digital field memory for television receivers" of H.J. Pelgrom et al in I.E.E.E. Transactions on Consumer Electronics, Volume CE-29, No.3, Aug. 1983, p. 242/248. In this application, the SPS memory is used for storing video information of a T.V. frame in digitized form.

For this application as picture memory, it is desirable that a memory is available which can be used practically universally in different video systems (PAL and NTSC) both for the standard signals (625 lines-525 lines) and for non-standard signals, which may be generated, for example, for a VCR. As a result, it may happen that the number of lines in the memory in a practical application is too large. As already stated in the aforementioned publication, an excess number of lines not filled with active video data may be passed on at an increased speed during the fly-back time. In this manner, it is possible to shorten the time of residence in the memory and hence to adapt the memory to the specific application. In the normal mode, the de-interlacing electrodes are operated in such a manner that during the first half line only signals of, for example, the odd parallel channels 1,3,5 etc. are passed on from the parallel section to the series output register, while in the second half of a line period this is the case only for the signals of the even parallel channels.

The lines not filled with active video information when passed on at an increased speed will generally contain charge. Therefore, it should be ensured that also when the excess number of lines is passed on at an increased speed, the de-interlacing electrode structure is always entirely emptied.

SUMMARY OF THE INVENTION

The invention has inter alia for its object to achieve this with the smallest possible number of additional components. For this purpose, according to the invention, a semiconductor memory of the kind mentioned in the opening paragraph is characterized in that means are provided for activating the de-interlacing electrodes according to n different procedures, which each correspond to one of the sublines and can be carried out in order of succession with an adjustable difference in time which is determined by the speed at which the data are transported through the parallel section to the de-interlacing electrodes.

In a simple manner, in a memory according to the invention the time interval between successive deinterlacing processes can be adapted to the speed at which the parallel section is operated Preferably, this speed is detected by detection means integrated in the semi-conductor body itself so that for activating the de-interlacing electrodes no external control signal (i.e. produced outside the chip) is required.

BRIEF DESCRIPTION OF THE DRAWINGS

The invention will be described more fully with reference to an embodiment and the accompanying diagrammatic drawing, in which:

FIG. 3 is a sectional view along a part of one of the parallel the parallel section, FIG. 4 shows two potential diagrams in the part of the device shown in FIG. 3 during operation, FIG. 5 shows clock voltages as a function of the time t, which are applied in the normal mode.

For explanation of the invention, first a few known principles of the SPS memory essential to the understanding of the invention are briefly disclosed. For this purpose, FIG. 1 shows diagrammatically an SPS memory having a series input register 1, a parallel section 2 and a series output register 3. The direction of transport in the series registers is from the lefthand to the righthand side and in the parallel section from top to bottom. The series registers 1 and 3 are divided into compartments each representing a charge storage site of the CCD register. In the drawing, the series registers 1 and 3 have a length of five stages, but it will be appreciated that in practical embodiments this number will be considerably larger The parallel section is composed of a large number of channels $K_1, K_2, K_3 ... K_9, K_{10}$, which constitute the actual memory matrix. As appears from the drawing, two channels $K_j$ and $K_{j+1}$ of the parallel section correspond to each stage of the series registers so that the parallel section comprises 10 channels $K_j$. The data are serially supplied to the input 4 of the series input register 1 and are transported from the input register in parallel into the parallel section. This parallel transfer is indicated by arrows. In the parallel section, the data are transported from top to bottom and, when they have arrived at the bottom, they are transported again in parallel into the output register 3. In the series output register 3, the data are transported to the righthand side in order that they can be read out serially again at the output 5.

Figure 1:
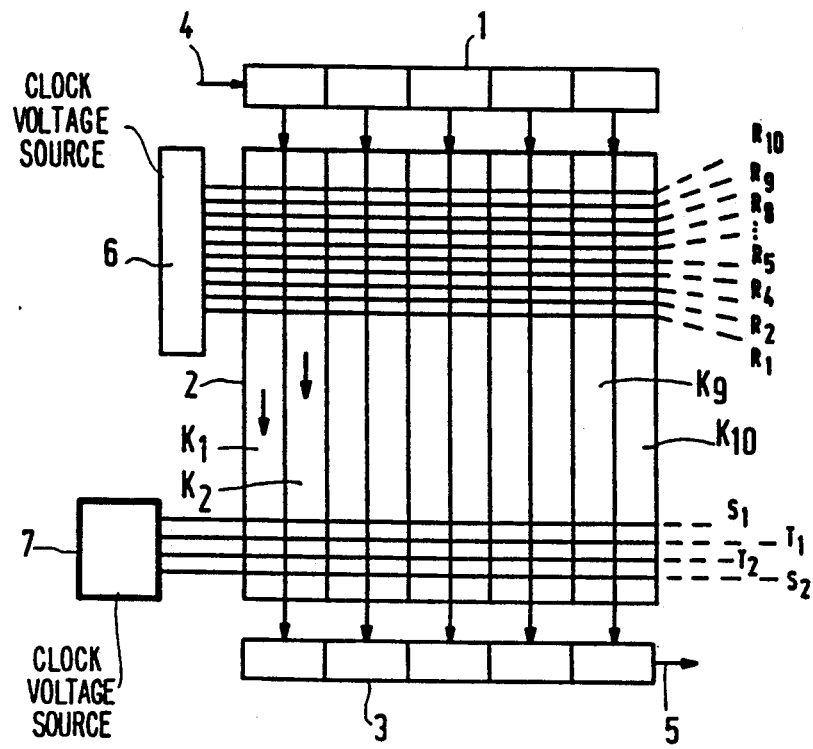
FIG. 1 shows the circuit diagram of an SPS memory according to the invention.

The series input and output registers are provided with a conventional clock electrode system (not shown to prevent the drawing from becoming unduly complicated), with which the registers can be operated as a well known 2-, 3-or 4-phase system. The parallel section is operated as a one-electrode/bit or ripple phase system, in which in the normal mode of operation one empty storage site is shifted along a row of, for example, 9 successive filled storage sites. In the drawing, a group of 10 electrodes $R_1, R_2, R_3, ... R_{10}$ is shown diagrammatically. The electrodes $R_i$ of the parallel section are activated by a clock voltage source indicated in the drawing diagrammatically by the block 6. For the sake of clarity, not all the clock electrodes $R_i$ are shown. The pattern is repeated until the whole parallel section is covered as far as the electrodes $S_1, T_1, T_2, S_2$. The electrodes $S_1, T_1, T_2$ and $S_2$ constitute the de-interlacing electrodes and are connected to a voltage source 7, supplying the de-interlacing clocks.

Figure 2A:
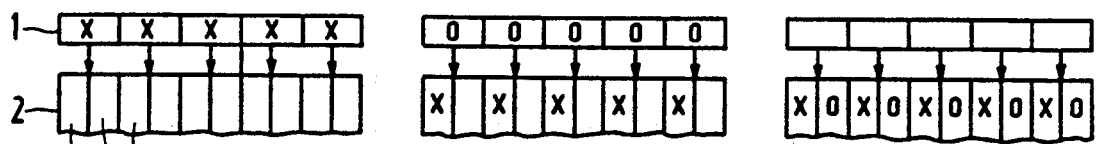
FIG. 2a the process of introducing to the de-interlacing method.

Since each stage of the series registers 1, 3 correspond to two channels in the parallel section 2, the operations of reading in and reading out a line in the parallel section are carried out in two steps, while, when carrying out the read-in operation, two half lines are interlaced and, when the read-out operation is carried out, these half lines have to be de-interlaced again. This mode of operation, which is known per se, is shown diagrammatically in FIGS. 2a and 2b. FIG. 2aa shows the situation, in which the series input register 1 is filled with a first half line of data. These data are indicated by crosses. When the input register 1 is full, the data are transported in parallel into the parallel section, i.e. in the parallel channels $K_1, K_3$ etc., briefly designated as the odd channels. When the input register 1 is empty, the next half line of data, each indicated by a 0, is introduced into the input register. The first half line (cross) meanwhile remains in the first row of storage sites in the parallel section. This situation is shown in FIG. 2ab. Subsequently (FIG. 2ac), the data of the second half line are transferred to the parallel section and are stored in the even-numbered channels $K_j$ (even channels). The upper row of the parallel section is then entirely filled with data, which can be transported parallel towards the series output register.

Figure 2B:
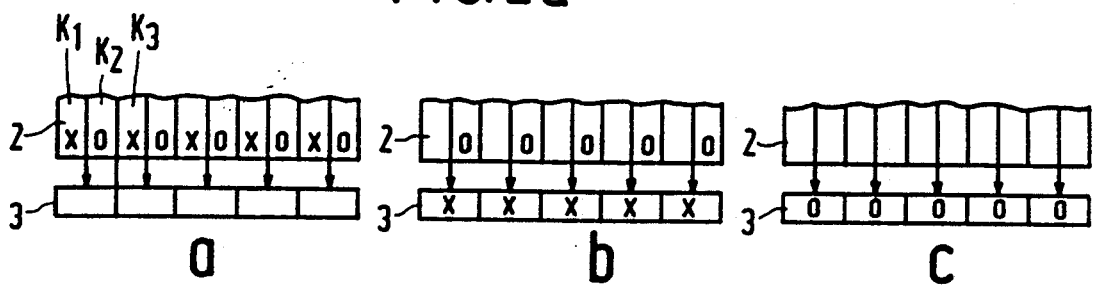
FIG. 2b shows diagrammatically the process of discharging data according to the de-interlacing method.

For reading out, the sublines must be de-interlaced again in order that they can be transported successively into the series output register FIG. 2ba shows the situation, in which a data line has arrived in the parallel section 2 at the transition between the parallel section and the output register 3. First (FIG. 2bb) the data of the odd channels $K_1, K_3, K_5$ (indicated by crosses) are transferred to the series register 3, while the data in the even channels remain in the parallel section 2. The series register 3, which is entirely filled, can then be read out. When the series register is empty again, the data of the second sublines in the even channels indicated by an O can be transferred to the series register 3 (FIG. 2bc)and be read out.

Figure 7:
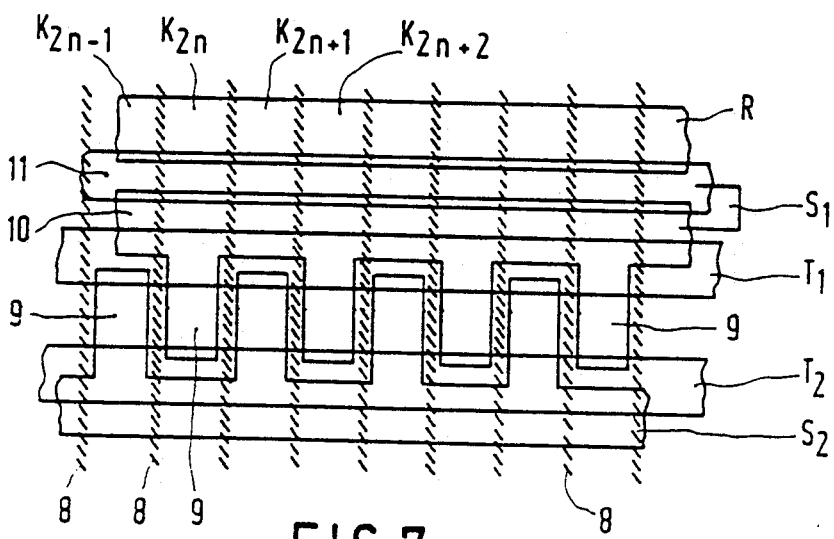
FIG. 7 is a plan view of a part with the transition from the parallel section to the series output register of the device shown in FIG. 1.

The de-interlacing method described here is carried out with de-interlacing electrodes, of which a possible embodiment is shown in FIG.7. This Figure shows in plan view a part of the parallel section 2 with the de-interlacing electrodes $S_1, T_1, S_2, T_2$. In the drawing, moreover a number of parallel channels $K_{2n-1}, K_{2n}, K_{2n+1}$ mutually separated by channel limiting regions 8 are shown. The de-interlacing electrodes comprise two interdigitated comb-shaped electrodes $S_1$ and $S_2$ with finger-shaped projection parts 9. The fingers 9 of $S_1$ and $S_2$ extend above the even and odd channels K, respectively, of the parallel section 2. Above the spaces between the fingers 9 of one electrode and the base strip of the other electrode, transfer electrodes $T_1$ and $T_2$ are arranged. The electrode $S_1$ consists of a storage part 10 and a transfer part 11. The drawing further shows the last clock electrode R. The operation of the de-interlacing electrode structure is described inter alia in Netherlands Pat. application No. 8,105,397 in the name of the Applicant laid open to public inspection and is summarized as follows. By activating the electrode $S_1$, a line of data present below the electrode R is transported to the storage sites below $S_1$. By then activating, for example, $T_1$ and $S_2$ and applying $T_2$ to a non-active voltage level, the charge packets in the odd channels can flow to the storage sites below $S_2$. The charge packets below the fingers 9 of $S_1$ are not transferred. The charge packets in the odd channels can be transported from the storage sites below $S_2$ further to the read-out register 3. When these charge packets have been read out, the data left in the even channels can also be transported further.

It should be noted that the specific configuration of the de-interlacing electrodes described here is to be considered only as an example, but that within the scope of the invention de-interlacing electrodes having a different configuration may also be used.

FIG. 3 is a sectional view of a part of a channel of the parallel section 2. The device comprises a p-type silicon substrate 12, of which the surface is covered by a thin gate oxide layer 13. On this oxide are disposed the clock electrodes R, of which one group $R_1...R_{10}$ is shown in FIG. 3. For the sake of simplicity of the description, an embodiment is given here, in which the clock electrodes are composed of a transfer part a and a charge storage part b, the parts a and b being interconnected and means (9), such as a doped region, being provided in order to obtain a potential barrier below the transfer parts a. However, it will be appreciated that other embodiments and, for example, separately controlled transfer electrodes and storage electrodes may also be used. The clock electrodes are connected to clock lines 15 shown diagrammatically, through which the clock voltages, which for the sake of simplicity are also designated by $R_1...R_{10}$, are supplied.

FIG. 5 shows the diagram of the clock voltages R, which are applied in the normal mode of operation, as a function of the time t. FIG. 4 shows the associated potential distribution in the channel at two different instants. The cross-hatched area in FIG. 4 represents a charge packet (data). At the instant $t_0$, all electrodes are at their low voltage level. This level is chosen so that below the electrodes $R_i$ potential wells are formed, in which charge can be stored. The device is operated in such a manner that a charge packet is present below nine of the ten electrodes and that the potential well below only one electrode, in this case the electrode $R_6$, is empty. At $t_1$, a voltage pulse is applied to $R_6$, as a result of which the surface potential below $R_6$ increases and the potential well below $R_6$ becomes so deep that the charge stored below $R_7$ flows into the potential well $R_6$. The empty site has now shifted over a distance of one electrode to the lefthand side. When now $R_7$ is activated, the packet which at $t_0$ is present below $R_8$ is transported to below $R_7$. When the empty site has shifted entirely to the lefthand side, each charge packet has shifted over a distance of one electrode to the righthand side.

In FIG. 5, moreover clock voltages $S_1$, $T_1$, $T_2$, $S_2$ are indicated by way of example, which are applied to the de-interlacing electrodes. It is then assumed that the threshold voltage below the transfer electrodes $T_1$ and $T_2$ is equal to that below the transfer parts a of the clock electrodes R and that the threshold voltage below the storage electrode $S_2$ is equal to the threshold voltage below the parts b of the clock electrodes R. The electrode $S_1$ is composed of a transfer part having a high threshold voltage and a storage part having a lower threshold analogous to the clock electrodes R. When $S_1$ is activated, the information in the row below the last clock electrode R can be transported to below $S_1$. Subsequently, the data in the odd channels are transported in the time interval 21 by activation of $T_2$ and $S_2$ to below the electrode $S_2$, while the data in the even channels are left below $S_1$ due to the barrier below $T_1$. When the information from the odd channels has been read out, the information in the even channels can be transported further by activating $T_2$ and $S_2$ in the time interval 22.

Figure 6:
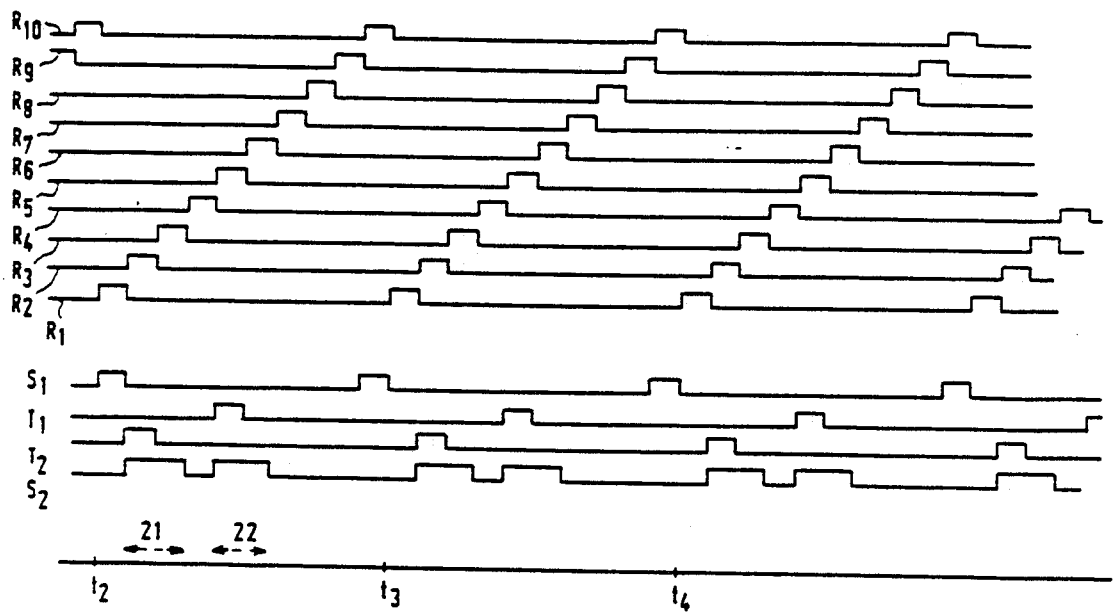
FIG. 6 shows the corresponding clock voltages at a function of the time t, which are applied in the mode with transfer at increased speed.
Figure 8:
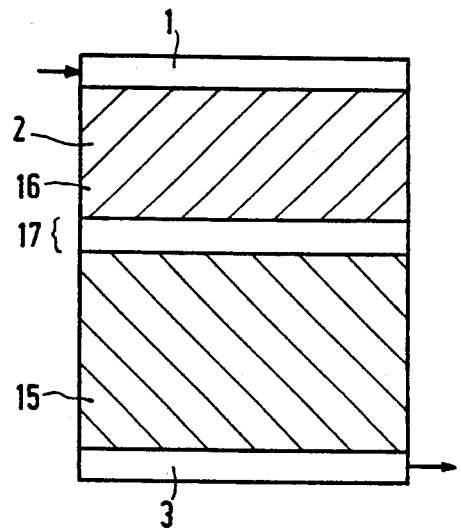
FIG. 8 shows diagrammatically the memory shown in FIG. 1, in which, however, the division of lines filled with active video and lines filled with non-active video information is indicated.

When the SPS memory described here is used as a T.V. memory, preferably the capacity (number of bits) will be determined by the T.V. system having the largest number of lines, i.e. by the 625 lines system. Since a frame is composed of two interlaced half frames of about 312 lines and 24 lines thereof corresponding to the frame fly-back do not contain active video information, in a practical embodiment the storage capacity is about 290 lines. When such a memory is used, for example, in a 525 lines T.V. system, in which only about 240 lines are required for a half frame, during operation, each time 50 memory lines not filled with active video information will be present between two successive half frames. This is shown diagrammatically in FIG. 8. In this drawing, the series input register 1 and the series output register 3 as well as the intermediate parallel section 2 are indicated. The cross-hatched parts 15,16 represent diagrammatically parts of the parallel section, in which data of two successive (half) frames are stored. These (half) frames are mutually separated by a strip 17 of 50 memory lines not filled with active video information. These lines, which generally do contain electrical charge, are displaced in the situation shown in FIG.8 at a speed determined by the clock voltages $R_1$. $R_{10}$ according to FIG.5. When the frame 15 has been read out entirely, the next frame 16 has been written entirely into the memory. The parallel section 2 can then be operated at a higher frequency, as a result of which the lines 17 can be passed on at an increased speed. This variation in the speed at which the data lines are transported through the parallel section can be realized in a manner shown diagrammatically in the time diagram of FIG. 6. It should be noted that in FIG. 6 also the clock voltages of the de-interlacing electrodes are indicated. This will be explained more fully at a later stage of the description. In the normal mode shown in FIG. 5, the horizontal line period of a T.V. line practically corresponds to the time between two successive pulses at an arbitrary electrode $R_i$. The clocks are chosen so that approximately in the first half line period, i.e. in the time interval $t_2-t_3$, a pulse is applied to all electrodes $R_1...R_{10}$. In the second half of a line period, i.e. in the interval $t_3-t_4$, the voltages at the electrodes do not vary so that the stored data below the electrodes $R_1-R_{10}$ are stationary. When the data lines have to be transferred at an increased speed, as shown in FIG.6, voltage pulses are applied to the electrodes $R_1-R_{10}$ not only during the first half $t_2-t_3$ of a T.V. line period, but also during the second half $t_3-t_4$ of the line period. In this mode, the de-interlacing electrodes have to be operated in a manner different from that in the normal mode, in order to ensure that the storage sites below the de-interlacing electrodes are always emptied before a next data line is supplied. The problem of the synchronization is further illustrated in the time diagram of FIG. 10a. In this drawing, the curve a indicates the pulses of the horizontal line flyback time, which can be generated in a usual manner by a Sync. I.C. from the trapped video information. The curve c indicates the clock of the memory, which generates 720 pulses per line period. These pulses are not shown to scale in the drawing. In the curve b, the cross-hatched part represents the time interval in which active video information is supplied in a T.V. line period. The curve d indicates a memory control signal (gate memory), which can be derived from the horizontal synchronization signal (curve a) and which determines in principle when the different operations in the memory have to be carried out. The curve d indicates the memory control signal for operation in the normal mode. The curve e indicates the time interval in which during operation in the normal mode the clock voltages $R_1-R_{10}$ are supplied in a line period to the clock electrodes of the parallel section 2. As already has been described above with reference to FIG. 5, these clock voltages are supplied in the normal mode only in the first half of a whole line period. Subsequently, the voltage at the clock electrode of the parallel section varies no longer. In the curve f, the two time intervals 21 and 22 indicated by full lines represent the period in which the de-interlacing electrodes S, T are activated for the odd channels $K_1$, $K_3$, $K_5$ etc. and the even channels $K_2$, $K_4$, $K_6$, respectively, of the parallel section 2.

When now in the mode at an increased speed the additional clocks $R_1$-$R_{10}$ are applied between $t_3$ and $t_4$ (FIG.6) before the procedure of the de-interlacing clocks 22 has been handled, the clock voltage generator for the de-interlacing electrodes could be started anew, as a result of which instead of the clocks 22 the clocks 21 would be generated so that in the even channels accumulation of charge could occur.

Figure 9:
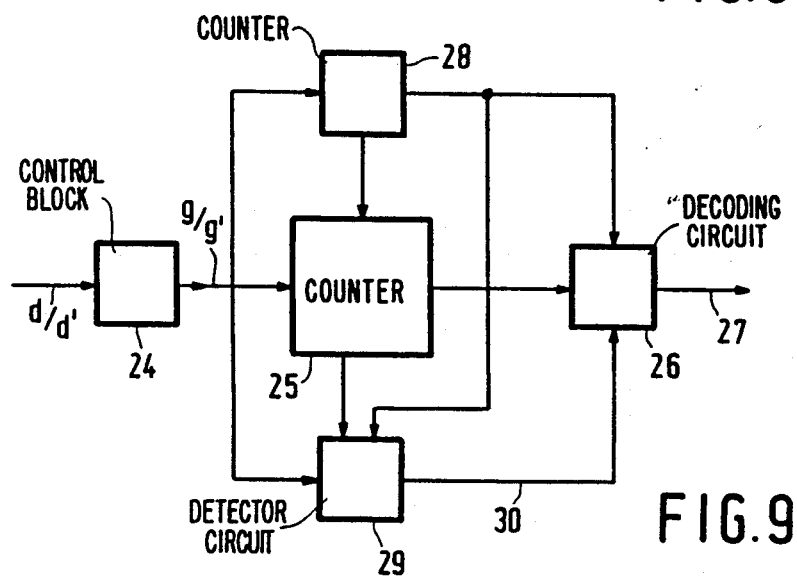
FIG. 9 shows a block diagram of (a part of) the circuit generating the de-interlacing clocks, FIG. 10 composed of FIG. 10a and FIG. 10b shows a time diagram of signals occurring during operation in the device shown in FIG.9.

FIG. 9 shows the block circuit diagram of a circuit by which the procedures for generating the de-interlacing clock voltages can be adapted to the specific mode of operation of the parallel section. The circuit comprises at the input a control block 24 which generates from the memory control signal d (or d', which will be explained further below) a reset signal a/g'. This signal is used to start a one-to-ten counter 25, which can be used in known manner to generate via a decoding circuit not shown the clock voltages $R_1$-$R_{10}$. The counter 25 further ensures via a decoding circuit 26 that the de-interlacing clocks (shown diagrammatically by the arrow 27) are generated. The diagram further show a second counter 28, which in the first place controls the decoding circuit 26 and hence determines, which clocks are passed (time interval 21 or 22). The counter 28, which is itself reset by the reset signal g or g', also starts the counter 25, as a result of which the counter 25 can be started anew half-way a line period for generating the even de-interlacing clocks in the time interval 22 (FIG. 10a). The circuit diagram finally comprises a detector circuit 29, which detects the mode in which the parallel section 2 is operated and supplies a signal 30 controlling the decoding circuit 26. The detector circuit 29 receives signals originating from the control block 24, the counter 25 and the counter 28. The signal from the detector 29 becomes active in the case in which a reset pulse g' (FIG. 10) occurs for the instant that the de-interlacing procedure 22 for the even channels is terminated, i.e. falls within the interval $t_a$. It can be ensured by this signal that the decoding circuit 26 no longer generates either the odd de-interlacing clock voltages 21 or the even de-interlacing clock pulses 22, but generates the odd voltages 21 immediately followed by the even voltages 22. The passage from the normal mode to the mode with transfer at increased speed is effected without any difficulty because upon change-over charge is present only below the de-interlacing electrodes in the even parallel channels. Upon the passage from the mode with transfer at increased speed to the normal mode, during the first half of the line the charge below the de-interlacing electrodes in both the odd and the even channels is transported to the series output register. Subsequently, during the second half of the line period, only the procedure for the even de-interlacing clock voltages is carried out. Upon the next reset pulse, the signal 27 disappears and the memory operates again in the normal mode.

Figure 11:
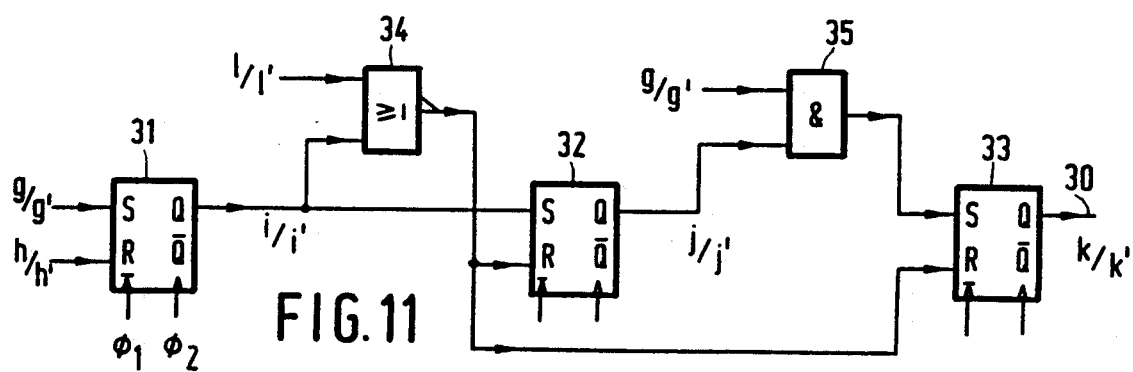
FIG. 11 shows a block diagram of an embodiment of the detector circuit 29 shown in FIG. 9.

FIG. 11 shows the block circuit diagram of a possible embodiment of the detector 29. The circuit comprises three SR flip-flops 31, 32, 33. The reset signal g and the signal h originating from the counter 28 (which generates a pulse halfway a line) are supplied to the S input and the R input, respectively, of the flip-flop 31. It should be noted that the signals without an accent represent the signals in the normal mode and the signals with an accent (for example g') represent corresponding signals in the mode with transfer at an increased speed. The time diagram of the latter signals is shown in FIG. 10b. The output Q of the flip-flop 31 delivers the signal i or i'. The signal i is supplied to the S input of the flip-flop 32 and to one of the inputs of a NOR gate 34. The other input or inputs of the NOR gate 34 is or are coupled to the output e/e' of a counter not shown in the drawing. The Q output of the flip-flop 32 delivers the signal j/j' (FIG. 10), which is supplied to an input of the AND gate 35. The R input of the flip-flop 32 is connected to the output of the NOR gate 34.

The output signal j or j' of the flip-flop 32 is compared by means of the AND gate 35 with the reset signal g (g'), which is supplied to another input of the gate 35. The output signal of the AND gate 35 is supplied to the S input of the flip-flop 33. The output signal of the NOR gate 34 is supplied to the R input of the flip-flop 33.

During operation, in the normal mode the flip-flop is set by the signal g (FIG. 10a) at the instant $t_1$ to that position in which the Q output delivers a high signal i, further designated by "1". It should be noted that the instant $t_1$ is slightly delayed with respect to the pulse g due to the clocks $\phi_1$, $\phi_2$, by which the flip-flops 31, 32, 33 are clocked. At $t_2$, the flip-flop 31 is reset again by the pulse h, which is generated halfway the line period by the counter 28. The sigal i also adjusts the flip-flop 32 so that after the signal i also the signal j becomes high. At the instant $t_3$ when i is again =0 and is also =0 at the two other inputs 1 of the NOR gate 34, the output of the gate 34 becomes equal to "1", as a result of which the flip-flop 32 is reset, that is to say that the output Q becomes equal to "0". It can be seen from comparison with the signals g and j in FIG. 10a that the output of the AND gate 35 is always equal to "0" in the interval $t_1$-$t_3$. The output Q of the flip-flop 33, at which control signal was generated, will therefore always be low (indicated in FIG.10a by the line k) in the normal mode. This signal k can be used as a control signal, which determines that in the first half line the de-interlacing clocks 21 for the odd parallel channels are passed and in the second half line the de-interlacing clocks 22 for the even parallel channels are passed.

In the mode with transfer at an increased speed in the parallel section, the memory control signal d' (FIG. 10b) delivers a pulse in the second half of the line period ($t_3$'). The passage from the normal mode to the mode at increased speed is now effected as follows. In the first half of a T.V. line period, i.e. in the interval $t_1'$-$t_2'$, the procedure is effected in the same manner as in FIG.10a. At $t_3'$ a reset pulse g' appears again, as a result of which the flip-flop 31 is set to the condition Q=$i^1$=1. The NOR gate 34 remains at O, as a result of which the flip-flop 32 remains in the condition Q=j'=1. The AND gate 35 then delivers an output signal 1, as a result of which the flip-flop 33 is set to the condition Q=k'=1. This signal can be used to achieve via further known combinatorial logic circuits that now in each half of a line period the de-interlacing clocks 21 for the odd parallel channels and the clocks 22 for the even parallel channels are passed to the de-interlacing electrodes. FIG. 10a shows a combination of periods of clocks 21,22 (partly in broken lines). In FIG. 6, the clock voltages $S_1$, $T_1$, $S_2$, $T_2$ are shown for the mode at an increased speed. The form of the clock voltages $S_i$, $T_i$ is identical to that of the clock voltages $S_i$, $T_i$ in FIG. 5. The periods 21 and 22 now follow each other immediately, as shown in FIG. 6, in such a manner that in each cycle $R_1-R_{10}$ the complete clock voltage cycle $S_i$, $T_i$ is carried out, as a result of which all charge below the de-interlacing electrodes can be transported to the output register.

This situation continues as long as an additional reset pulse g' occurs about halfway the line period.

At the transition from the mode with transfer at an increased speed to the normal mode, during the first half of the line period both the even and the odd de-interlacing clocks are generated, as a result of which all storage sites below the de-interlacing electrodes are emptied.

Due to the fact that the reset pulse g' at $t_3$' now no longer appears, the detector 29 again passes to the state shown in FIG. 10a, as a result of which in the second half of a line only the even de-interlacing clocks are generated.

It will be appreciated that the invention is not limited to the embodiments shown, but that within the scope of the invention many further variations are possible for a person skilled in the art. More particularly, the detector 29 may be composed in many ways different from that described.

I claim:

1. A semiconductor memory comprising a charge-coupled device of the SPS type having a series input register, a parallel section and a series output register, the number of data that can be stored per line in the parallel section being the n-multiple (where n=integer and larger than or equal to 2) of the number of data that can be stored in the series input register and the series output register, while at the transition between the parallel section and the series output register an electrode configuration is present (designated as de-interlacing electrodes), by means of which a line of data in the parallel section can be split up into n sublines, which can be transported successively in the series output register, the parallel section being provided with clock voltage means with the aid of which the data are transported at an adjustable speed through the parallel section, characterized in that means are provided for activating the de-interlacing electrodes according to n different procedures, which each correspond to one of the sublines and can be carried out in order of succession with an adjustable difference in time, which is determined by the speed at which the data are transported through the parallel section to the de-interlacing electrodes.

2. A semiconductor memory as claimed in claim 1, characterized in that the data can be transport through the parallel section either at a comparatively low speed designated as standard speed or at a comparatively high speed exceeding the standard speed, and in that the said means for activating the de-interlacing electrodes are such that at the said high speed with each line of data transported to the de-interlacing electrodes charge of data of the preceding line of data is not present any more below the de-interlacing electrodes.

3. A semiconductor memory as claimed in claim 1, characterized in that the speed at which charge packets are transported through the series registers does not vary when the parallel section is changed over from one speed to the other.

4. A semiconductor memory as claimed in claim 1, characterized in that, when data lines are transported at the comparatively high speed through the parallel section, the n different procedures for activating the de-interlacing electrodes are carried out at least practically immediately in succession.

5. A semiconductor memory as claimed in claim 1, characterized in that detection means are provided which can supply an output signal giving information about the speed at which data are transported through the parallel section and which can be used to adjust the speed at which the n different procedures for activating the de-interlacing electrodes are carried out in order of succession.

6. A semiconductor memory as claimed in claim 2, characterized in that detection means are provided which can supply an output signal giving information about the speed at which data are transported through the parallel section and which can be used to adjust the speed at which the n different procedures for activating the de-interlacing electrodes are carried out in order of succession.

7. A semiconductor memory as claimed in claim 3, characterized in that detection means are provided which can supply an output signal giving information about the speed at which data are transported through the parallel section and which can be used to adjust the speed at which the n different procedures for activating the de-interlacing electrodes are carried out in order of succession.

8. A semiconductor memory as claimed in claim 4, characterized in that detection means are provided which can supply an output signal giving information about the speed at which data are transported through the parallel section and which can be used to adjust the speed at which the n different procedures for activating the de-interlacing electrodes are carried out in order of succession.

* * * * *